United States Patent
Rodgers et al.

(10) Patent No.: US 7,167,037 B2
(45) Date of Patent: Jan. 23, 2007

(54) CHARGE PUMP BIAS NETWORK

(75) Inventors: Paul L. Rodgers, Solana Beach, CA (US); William R. Goyette, San Marcos, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 45 days.

(21) Appl. No.: 11/147,913

(22) Filed: Jun. 7, 2005

(65) Prior Publication Data
US 2006/0273835 A1    Dec. 7, 2006

(51) Int. Cl.
*H03K 17/16* (2006.01)
*H03L 7/093* (2006.01)

(52) U.S. Cl. .................. 327/384; 327/157

(58) Field of Classification Search ........... 327/112, 327/157, 159, 384; 326/26, 56
See application file for complete search history.

(56) References Cited

U.S. PATENT DOCUMENTS 5,315,270 A * 5/1994 Leonowich ............. 331/1 A
6,724,265 B1 * 4/2004 Humphreys ............... 331/17
6,909,316 B1 * 6/2005 Owens et al. ............. 327/266

* cited by examiner

*Primary Examiner*—Timothy P. Callahan
*Assistant Examiner*—Terry L. Englund
(74) *Attorney, Agent, or Firm*—Tarolli, Sundheim, Covell & Tummino LLP

(57) ABSTRACT

A circuit for supplying selected currents to a charge pump without harmful effects arising from operation of current switches in the charge pump. A charge pump current setting is applied in digital form to a set of two-position switches coupled to binary-weighted current sources. Currents from the sources selected by the switches are combined, and the total current is mirrored to the charge pump. Simultaneously, those of the binary-weighted current sources not selected by the switches to contribute to the charge pump current are separately combined, and this total current is mirrored to an electrical replica of the charge pump. Thus the currents supplied to the charge pump and to the replica charge pump are complementary in the sense that they always add to a constant total current drawn from a common power supply. Therefore, abrupt changes in current load are avoided and switching noise effects are minimized.

8 Claims, 3 Drawing Sheets

CHARGE PUMP BIAS NETWORK

BACKGROUND OF THE INVENTION

This invention relates generally to circuits known as charge pumps and, more particularly, to charge pumps as used in conjunction with phase-locked loops (PLLs). Phase-locked loops are widely used in a variety of applications in which a time-varying signal must be synchronized (locked) with a reference signal. Typical applications include frequency synthesizers for radio receivers and transmitters, demodulation of radio signals, and recovery of clock timing information from received radio signals or from digital storage devices. A common PLL configuration includes a phase detector, a charge pump, a loop filter, and a voltage controlled oscillator, the output of which is fed back as an input to the phase detector. The theory of operation of PLL circuits that include a charge pump is well known in the art. Basically, the phase detector generates signals indicative of the phase difference between a time-varying signal and a reference signal. Then the charge pump, controlled by output signals generated by the phase detector, adds (or subtracts) a controllable amount of charge, i.e., current, to (or from) an output signal that it generates. This output signal is smoothed by the loop filter and then used to provide a voltage that controls the voltage controlled oscillator.

A conventional charge pump in the context of a PLL consists of a number of current switches, which are turned on and off under control of signals generated by the phase detector. Conceptually, the charge pump is sometimes described as being part of the phase detector, but for purposes of the present invention the charge pump is best considered a separate device. Charge pump circuits for PLL applications are extremely critical if low noise operation is desired. Conventional charge pump circuits contain multiple current sources that are switched on or off depending upon the desired pump output current. These switching operations necessarily result in abrupt changes in total current drawn by the charge pump circuit, and these abrupt current changes result in noise components that can modulate onto the power supply itself and adversely affect other sensitive components of the PLL.

Accordingly, there is a need for an improved charge pump circuit, or an adjunct to an existing charge pump circuit, which eliminates these switching noise components and enhances the overall performance of the PLL in which the charge pump circuit is employed. The present invention is directed to this end.

SUMMARY OF THE INVENTION

The present invention resides in a charge pump bias network that can be coupled to any of a variety of differently configured charge pump circuits, to reduce or eliminate unwanted noise components that would otherwise be introduced by switching operations of the charge pump circuit. Briefly, and in general terms, the charge pump bias network of the present invention comprises a power supply; a first circuit for drawing a desired current from the power supply to a charge pump circuit, based on a digital control signal indicative of a currently desired current setting for the charge pump circuit; and a second circuit, interconnected with the first circuit, for drawing a complementary current from the power supply to a replica charge pump circuit. A practically constant total current is drawn from the power supply, regardless of fluctuations in the desired current setting for the charge pump circuit, as reflected in the digital control signal. Therefore, abrupt changes in power supply current are avoided and resultant switching noise effects are minimized. The terms "replica charge pump circuit" and "electrical replica of the charge pump circuit" as used in this description are intended to mean either a circuit that duplicates all the components of the charge pump circuit, or a circuit or load that has essentially the same electrical characteristics as the charge pump circuit. In many instances, the replica charge pump circuit may be simply a "dummy" electrical load with impedance characteristics that mimic those of the charge pump circuit.

The charge pump bias network further comprises means for converting the digital control signal to a first current indicative of the desired current setting for the charge pump circuit, and simultaneously converting the digital control signal to a second current complementary to the first current. The first circuit further comprises a first current mirror, for mirroring the first current to the charge pump circuit, and the second circuit further comprises a second current mirror, for mirroring the second current to the replica charge pump circuit.

More specifically, the means for converting the digital control signal to the first and second currents comprises a plurality of current sources, weighted in accordance with the binary weights of respective bits in the digital control signal; and an equal plurality of two-position switches coupled to the respective current sources and having first and second output terminals. All of the first output terminals of the switches are coupled together to the first current mirror, all of the second output terminals are coupled together to the second current mirror, and the digital control signal is coupled to the plurality of switches to control their positions.

Using alternative wording, the charge pump bias network may also be defined as comprising a plurality (N) of binary-weighted current sources; an equal plurality (N) of two-position switches coupled to respective binary-weighted current sources, wherein each switch is controllable to connect a current source to a first output terminal or a second output terminal; a first common line connecting all the first output terminals of the switches to a first current mirror; a second common line connecting all the second output terminals of the switches to a second current mirror; and a power supply connected to supply current to the first and second current mirrors. The first current mirror is configured to mirror the current in the first common line to charge pump circuit, and the second current mirror is configured to mirror the current in the second common line to a replica charge pump circuit. An N-bit word that digitally defines a charge pump current setting at any given time is coupled to the switches to provide the desired charge pump current through the first common line, which is mirrored to the charge pump circuit. Simultaneously, a complementary current is provided to the second common line and mirrored to the replica charge pump circuit. This current is complementary in the sense that the total current drawn from the power supply remains constant, regardless of the charge pump current demand.

The invention may also be defined as a method for minimizing current switching effects in a charge pump circuit. The method comprises the steps of representing a desired charge pump current setting as digital word; generating a set of current signals proportional to binary-weighted components corresponding to the digital word; applying the set of current signals to a set of two-position switches, each with first and second output terminals; applying the digital word as a set of binary signals to control the set of two-position switches and thereby switching each of the binary-weighted current signals to the first or second output terminal of each corresponding switch; combining output currents from the first output terminals of the switches and applying the result as a first common current signal to a first current mirror; and combining output currents from the second output terminals of the switches and applying the result as a second common current signal to a second current mirror. The method further comprises mirroring, in the first current mirror, the first common current signal to the charge pump circuit; and mirroring, in the second current mirror, the second common current signal to a replica of the charge pump circuit. The current mirrored to the replica of the charge pump circuit is complementary to the current mirrored to the charge pump circuit, in the sense that the two currents always sum to a constant current drawn from a common power supply.

It will be appreciated from the foregoing that the present invention represents a significant advance in charge pump circuits, as used in conjunction with phase-locked loops (PLLs). In particular, the charge pump bias network of the invention minimizes or eliminates noise effects resulting from current switching operations of a charge pump circuit. Other aspects and advantages of the invention will become apparent from the following more detailed description, taken in conjunction with the accompanying drawings.

DETAILED DESCRIPTION OF THE INVENTION

Figure 1:
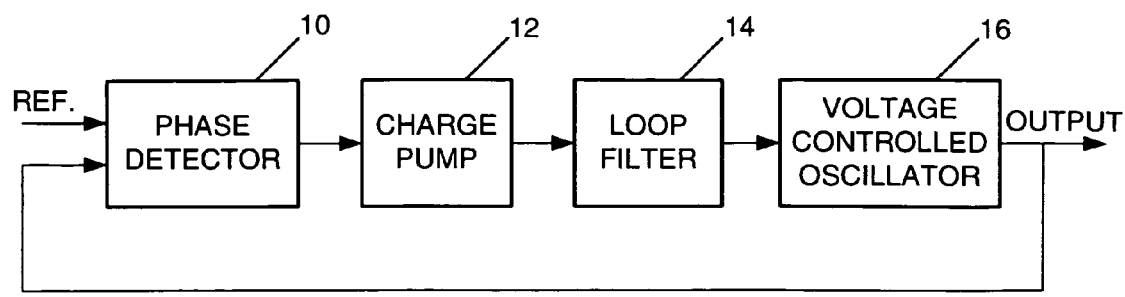
FIG. 1 is a block diagram of a phase-locked loop of the prior art.

As shown in the drawings for purposes of illustration, the present invention is concerned with charge pump circuits as used in phase-locked loops (PLLs). FIG. 1 shows the basic components of a PLL, including a phase detector 10, a charge pump 12, a loop filter 14 and a voltage-controlled oscillator (VCO) 16. The VCO 16 generates an output signal at a desired frequency and also feeds back this signal to the phase detector 10. If, for example, the phase of the oscillator output signal falls behind the phase of a reference signal applied to the phase detector 10, the phase detector causes the charge pump to increase its output, which is used to control the VCO to speed up the output signal. Similarly, if the output signal from the VCO 16 leads the phase of the reference signal, the phase detector 10 causes the charge pump circuit 12 to slow the VCO 16. The loop filter 14 is basically a low-pass filter that smoothes out the abrupt control signals from the charge pump 12. This feedback control system tends to converge on a state in which the phase detector 10 makes only very few small corrections. Many PLLs also include an N:1 frequency divider (not shown) between the VCO 16 and the phase detector 10. The effect of the divider is that when the PLL locks, the VCO 16 generates an output of N times the frequency of the reference signal.

Figure 2:
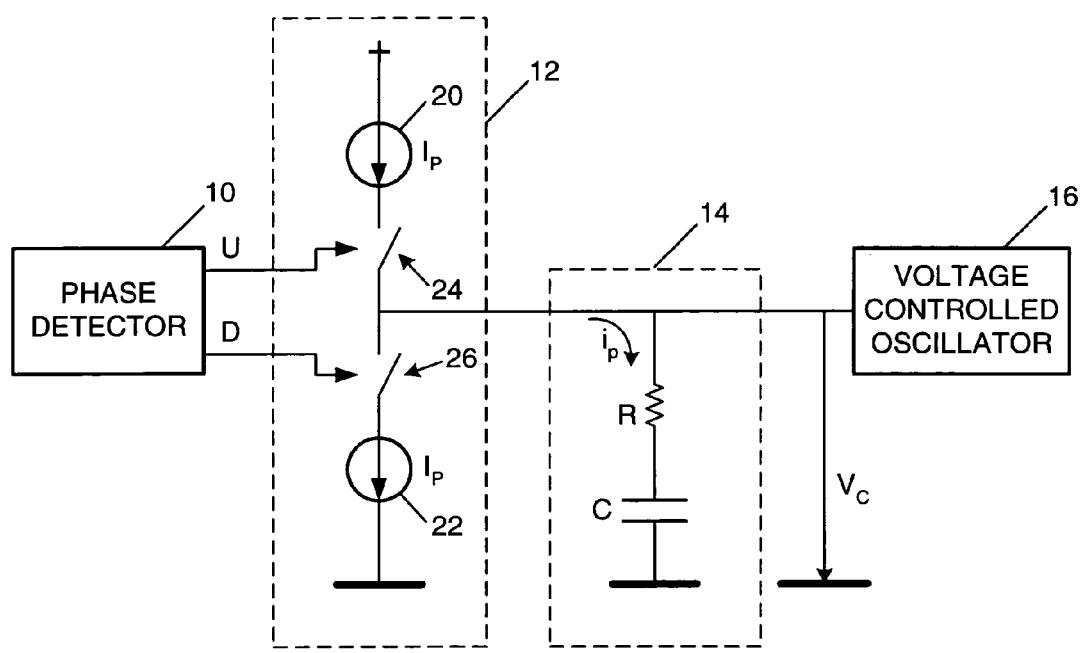
FIG. 2 is a block diagram showing in more detail how a charge pump circuit of the prior art operates in a phase-locked loop.

The principle of operation of the conventional charge pump circuit 12 is illustrated in FIG. 2. In its simplest form, a charge pump circuit 12 comprises two current sources 20 and 22 and two switches: an UP switch 24 and a DOWN switch 26. When the phase detector 10 determines that the oscillator frequency should be increased, it generates an output pulse on line U (up), and when the phase detector determines that the oscillator frequency should be decreased, it generates an output pulse on line D (down). A pulse on line U or D results in closure of either the UP switch 24 or the DOWN switch 26. Moreover, it will be apparent from FIG. 2 that closure of the UP switch results in output of a positive output pulse of current from the charge pump 12, and closure of the DOWN switch 26 results in a negative output pulse of current from the charge pump, i.e., current flows into the charge pump from the loop filter 14. The filter 14 is shown as including a resistor R and capacitor C connected in series between the charge pump output and ground. Thus, a positive output current pulse from the charge pump 12 results in charging of the capacitor C and an increase in the voltage output from the loop filter, and a negative current pulse results in discharge of the capacitor C and a decrease in the voltage output from the loop filter. In effect, the charge pump 12 illustrated has three possible switching states. Either both switches 24 and 26 are off (and no charge is added to or removed from the loop filter 14), or only the UP switch 24 is closed (resulting in adding charge to the loop filter), or only the DOWN switch 26 is closed (resulting in removal of charge from the loop filter). Normally, the phase detector 10 would not close both switches 24 and 26 at the same time.

Different design configurations of charge pumps may include more than just two switches but charge pumps all operate in principle the same way. That is to say, they all contain multiple current switches that are controlled to add charge to or remove charge from a downstream circuit, which as a consequence generates an appropriate output voltage to control the VCO 16 and to move the PLL toward a phase-locked state. Therefore, conventional charge pumps in PLLs contain current switches that necessarily and abruptly change the current drawn from the charge pump power supply. As noted above, these abruptly operated current switches may introduce noise components that affect operation of the PLL, especially at higher frequencies.

Figure 3:
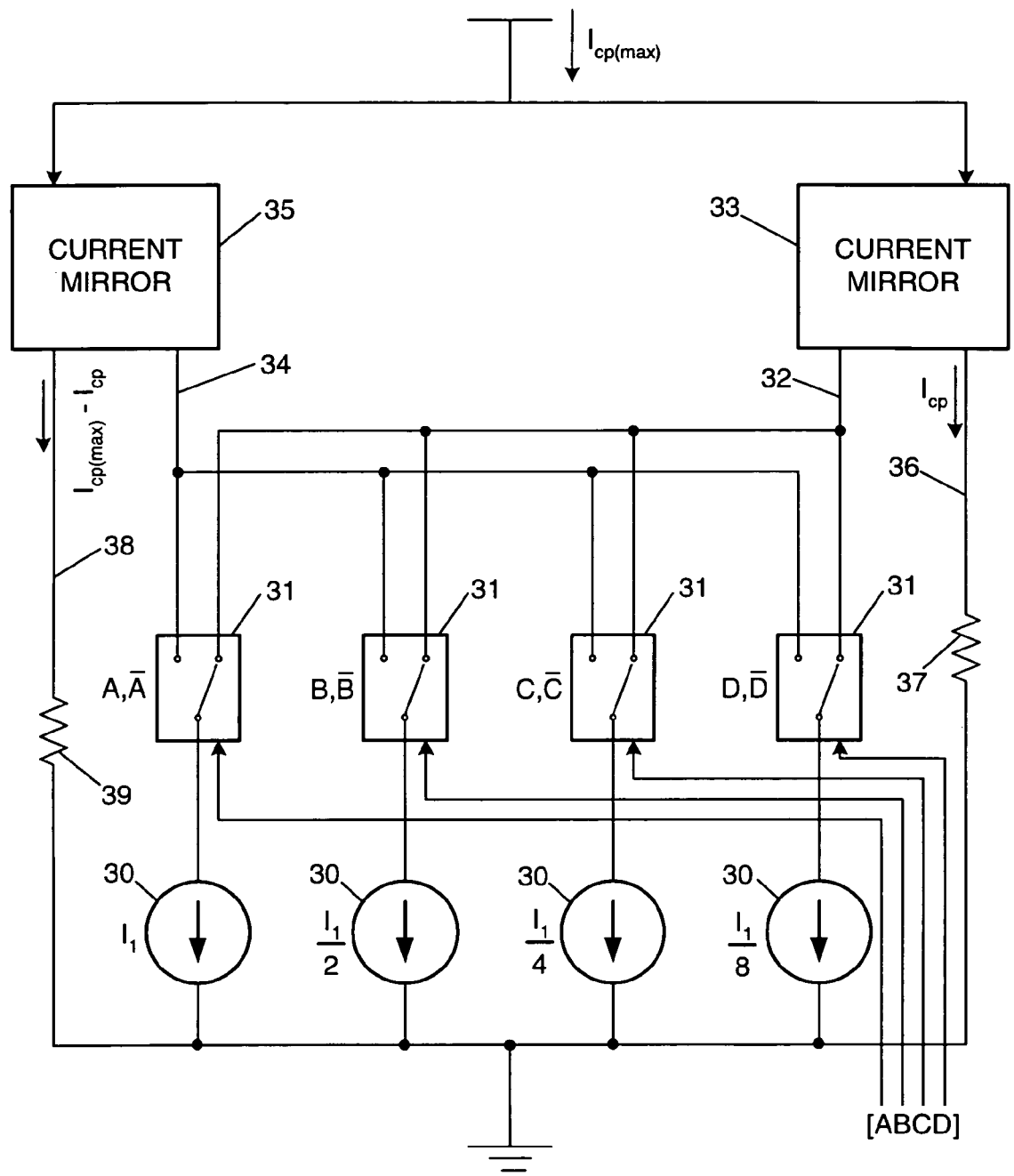
FIG. 3 is a functional schematic diagram of a charge pump bias network in accordance with the present invention.

In accordance with the present invention, a charge pump includes a bias network that ensures that the current drawn from the charge pump power supply remains constant. The principle of the bias network of the invention is shown in FIG. 3. The bias network includes multiple current sources 30, of which four are shown, and an equal number of binary switches 31. The current sources 30 generate currents that are binary fractions of each other. That is to say, the first source 30 generates a current $I_1$, the second one a current $½ I_1$, the third one $¼ I_1$ and the fourth one $⅛ I_1$. Each source 30 draws current through one of the switches 31, which are controlled by four binary signals A, B, C, and D, respectively. Each switch 31 in its first position draws current along a common path 32 and through a first current mirror 33. Each switch in its second position draws current along a second common path 34 and through a second current mirror 35.

A current mirror is a conventional circuit having first and second current paths, in which current in the first path is closely duplicated, or mirrored, in the second path. Some current mirrors are designed to produce an amplified current in the second path. In the present application of current mirrors, current in the first common path 32, to which some combination of the currents through sources 30 contributes, is mirrored in a current path 36 extending to a charge pump, shown for convenience as a resistor 37. Similarly, current in the second common path 34 is mirrored by the second current mirror 35 in a current path 38 connected to a replica charge pump 39. The replica charge pump may be a circuit that exactly duplicates every component of the charge pump or it may be simply an electrical replica of the charge pump, such as a "dummy" load.

The switches 31 are at any instant in time positioned in accordance with the binary word ABCD, which also represents the charge pump current setting at that instant. Each current source 30 is connected either to current mirror 33 or current mirror 35, depending on the position of the corresponding switch 31. If all the switches 31 are "on," meaning that all the current sources 30 contribute to current through common line 32, the total of the current contributions is mirrored in the charge pump current and virtually no current flows to the other current mirror 35. More generally, any current contribution from the sources 30 that does not contribute to path 32 through current mirror 33, goes instead to path 34 through current mirror 35. Stated another way, because the total current through sources 30 remains constant, the total of the currents in lines 36 and 38 is always constant, and this is the total current drawn from the power supply by the charge pump 37 and the replica charge pump 39. If the charge pump current is $I_{cp}$, then the replica charge pump current is $I_{cp(max)}-I_{cp}$, where $I_{cp(max)}$ is the maximum charge pump current. Note, however, that $I_{cp(max)}$ in this relationship does not include the current drawn from the power supply through common lines 32 and 34 by the current sources 30. If the current mirrors 33 and 35 are without current amplification, the total current drawn from the power supply would be 2 $I_{cp(max)}$.

The pump bias circuit of FIG. 3 may be implemented in a variety of ways. For example, the current sources 30 may be NPN bipolar transistors with appropriately selected resistors in the emitter circuits to provide the binary relationship between adjacent current sources. Each of the switches 31 may be a differential pair of NPN bipolar transistors with the collectors connected in common and with complementary control signals applied to the bases of the pair. The current mirrors 33 and 35 may also be implemented in various ways. For example, each may include a PFET (p-channel field-effect transistor) connected between one of the common lines 32 and 34 to the power supply, and configured to mirror the current in the PFET to another current source, located in line 36 to the charge pump circuit or in line 38 to the replica charge pump circuit.

Figure 4:
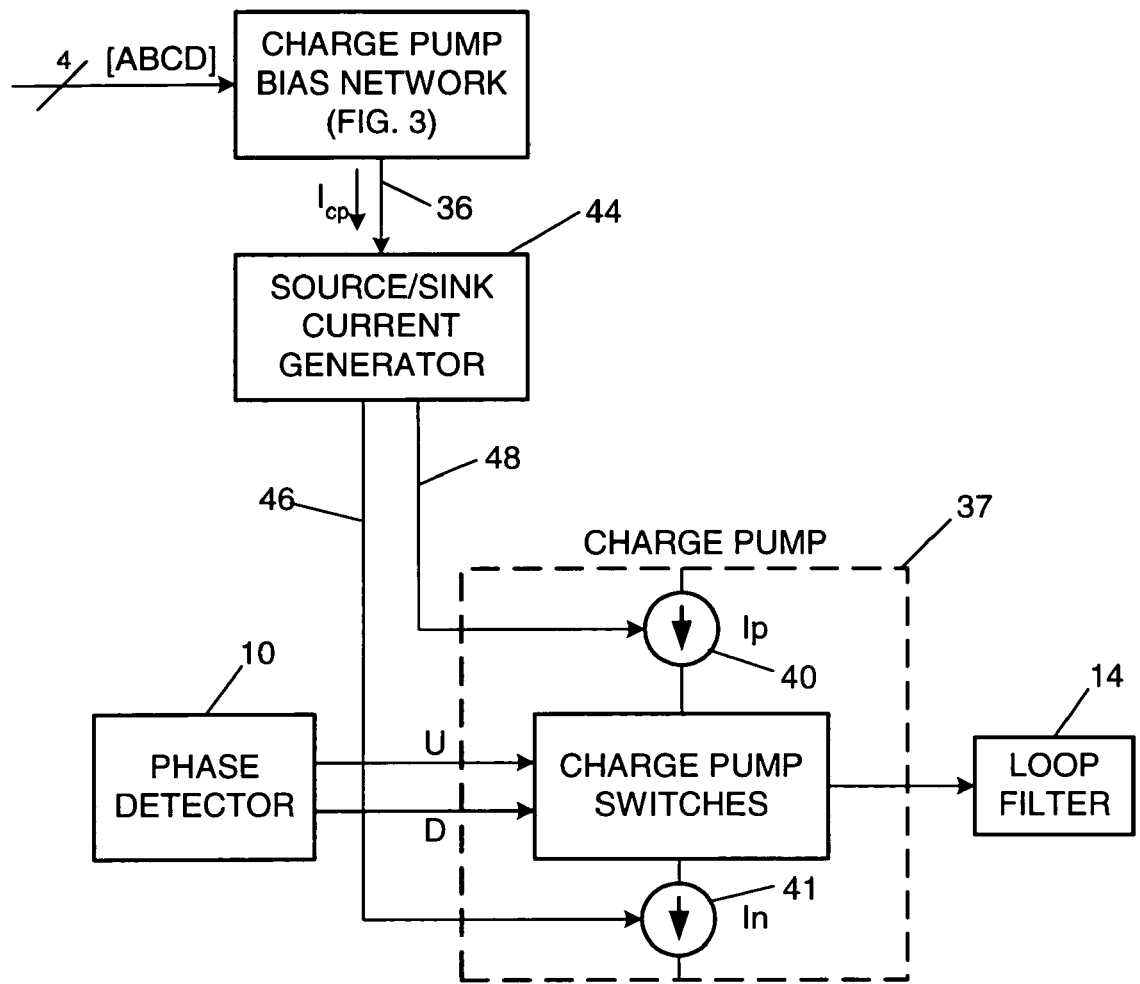
FIG. 4 is a block diagram showing how the charge pump bias network of the invention interfaces with a charge pump circuit.

FIG. 4 depicts how the charge pump bias network of FIG. 3 is typically interfaced with the charge pump 37. The illustrative charge pump 37 includes two current generators 40 and 41, which generate positive and negative charge, respectively to be coupled to the loop filter 14. The current generators 40 and 41 are shown as generating source and sink currents $I_p$ and $I_n$, respectively. Ideally, these currents should be identical to $I_{cp}$ or a multiple of $I_{cp}$ supplied by the pump bias network of FIG. 3. The phase detector 10 generates UP or DOWN switching signals, which are used to control the charge pump switches. A source/sink current generator 44 receives the current $I_{cp}$ from the charge pump bias network over line 36, and mirrors this current onto the current generators 40 and 41 through the two output lines 46 and 48. Other charge pump configurations are, of course, possible and would necessitate modifications to this interface circuitry.

The present invention maintains the overall power supply current at a substantially uniform level, even while current drawn by the charge pump circuit is abruptly switched to different levels as the charge pump operates to synchronize time-varying signals in a PLL. Therefore, the invention minimizes or eliminates the effects of abruptly varying the current consumed by the charge pump circuit. The only significant drawback to the invention is that maintaining the power supply current at a constant level comes at the expense of having a higher average power consumption than a circuit in which the power supply current varies in accordance with the needs of the charge pump.

It will also be appreciated that although a specific embodiment of the invention has been described in detail for purposes of illustration, various modifications may be made without departing from the spirit and scope of the invention. Accordingly, the invention should not be limited except as by the appended claims.

The invention claimed is:

1. A charge pump bias network, comprising:
   a power supply;
   a first circuit for drawing a desired current from the power supply to a charge pump circuit, based on a digital control signal indicative of a currently desired current setting for the charge pump circuit; and
   a second circuit, interconnected with the first circuit, for drawing a complementary current from the power supply to a replica charge pump circuit, in such a way as to maintain a practically constant total current drawn from the power supply, regardless of fluctuations in the desired current setting for the charge pump circuit, as reflected in the digital control signal, whereby abrupt changes in the drawn power supply current are avoided and resultant switching noise effects are minimized.

2. A charge pump bias network as defined in claim 1, and further comprising:
   means for converting the digital control signal to a first current indicative of the desired current setting for the charge pump circuit, and simultaneously converting the digital control signal to a second current complementary to the first current;
   and wherein the first circuit comprises a first current mirror, for mirroring the first current to the charge pump circuit as the desired current, and the second circuit comprises a second current mirror, for mirroring the second current to the replica charge pump circuit as the complementary current.

3. A charge pump bias network as defined in claim 2, wherein the means for converting the digital control signal to the first and second currents comprises:
   a plurality of current sources, binary-weighted in accordance with binary weights of respective bits in the digital control signal; and
   an equal plurality of two-position switches each coupled to a respective one of the plurality of current sources and having first and second output terminals, wherein all of the first output terminals are coupled together to the first current mirror and all of the second output terminals are coupled together to the second current mirror, and wherein the digital control signal is coupled to the plurality of switches to control their positions.

4. A charge pump bias network, comprising:
   a plurality (N) of binary-weighted current sources;
   an equal plurality (N) of two-position switches each coupled to respective one of the binary-weighted current sources, wherein each switch is controllable to connect the respective current source to a first output terminal or a second output terminal;

a first common line connecting all the first output terminals of the switches to a first current mirror;

a second common line connecting all the second output terminals of the switches to a second current mirror; and a power supply connected to supply current to the first and second current mirrors;

wherein the first current mirror is configured to mirror the current in the first common line to a charge pump circuit, and the second current mirror is configured to mirror the current in the second common line to a replica charge pump circuit;

and wherein an N-bit word that digitally defines a charge pump current setting at any given time is coupled to the switches to provide the desired charge pump current through the first common line and to the charge pump circuit, while simultaneously providing a complementary current to the second common line and to the replica charge pump circuit, such that the total current drawn from the power supply remains constant, regardless of charge pump current demand.

5. A charge pump bias network as defined in claim 4, wherein the replica charge pump circuit is a dummy load with electrical characteristics similar to those of the charge pump circuit.

6. A charge pump bias network as defined in claim 4, wherein each of the two-position switches comprises a differential transistor pair.

7. A charge pump bias network as defined in claim 4, wherein each of the current mirrors includes at least one field-effect transistor (FET) configured to mirror current through the FET to one of the charge pump circuit and the replica charge pump circuit.

8. A method for minimizing current switching effects in a charge pump circuit, the method comprising:

representing a desired charge pump current setting as a digital word;

generating a set of current signals proportional to binary-weighted components corresponding to the digital word;

applying the set of current signals to a set of two-position switches, each with first and second output terminals;

applying the digital word as a set of binary signals to control the set of two-position switches and thereby switching each of the binary-weighted current signals to the first or second output terminal of each corresponding switch;

combining output currents from the first output terminals of the switches and applying the result as a first common current signal to a first current mirror;

combining output currents from the second output terminals of the switches and applying the result as a second common current signal to a second current mirror;

in the first current mirror, mirroring the first common current signal to the charge pump circuit as the desired charge pump current; and in the second current mirror, mirroring the second common current signal to a replica of the charge pump circuit;

wherein the current mirrored to the replica of the charge pump circuit is complementary to the current mirrored to the charge pump circuit, in the sense that the two currents always sum to a constant current drawn from a common power supply.

* * * * *